(12) United States Patent
Fletcher et al.

(10) Patent No.: US 6,442,089 B1
(45) Date of Patent: Aug. 27, 2002

(54) MULTI-LEVEL, LOW VOLTAGE SWING SENSING SCHEME FOR HIGH SPEED MEMORY DESIGN

(75) Inventors: Thomas D. Fletcher; Kevin X. Zhang, both of Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/470,295

(22) Filed: Dec. 22, 1999

(51) Int. Cl.[7] .................................................. G11C 7/02
(52) U.S. Cl. ...................... 365/207; 365/233; 365/233.5
(58) Field of Search ........................... 365/230.03, 207, 365/205, 233, 233.5, 203, 49

(56) References Cited

U.S. PATENT DOCUMENTS

| 4,287,570 A | 9/1981 | Stark ........................... 365/104 |
| 4,658,160 A | 4/1987 | Young ......................... 365/190 |
| 5,386,394 A | 1/1995 | Kawahara et al. ........... 365/208 |
| 5,422,781 A | 6/1995 | DiMarco ...................... 365/226 |
| 5,751,648 A | 5/1998 | Braceras et al. ............. 365/205 |
| 5,751,655 A | * 5/1998 | Yamazaki ..................... 365/233 |
| 5,829,038 A | 10/1998 | Merrell et al. ............... 711/143 |
| 6,151,271 A | * 11/2000 | Lee .............................. 365/233 |

OTHER PUBLICATIONS

Zhao, Cangsang et al., "An 18–Mb, 12.3–GB/s CMOS Pipeline–Burst Cache SRAM with 1.54 Gb/s/pin," IEEE Journal of Solid State Circuits, vol. 34, No. 11, Nov. 1999, pp. 1564–1570.

* cited by examiner

Primary Examiner—A. Zarabian
(74) Attorney, Agent, or Firm—Cynthia T. Faatz

(57) ABSTRACT

A multi-level, low voltage swing memory sensing scheme. According to one aspect, low voltage swing local bitlines are provided to indicate data stored in a corresponding block of memory. The low voltage swing local bitlines are sensed on a transition of a first clock signal. Low voltage swing global bitlines indicate data sensed from the local bitlines and are sensed on a transition of a second clock signal.

27 Claims, 5 Drawing Sheets

MULTI-LEVEL, LOW VOLTAGE SWING SENSING SCHEME FOR HIGH SPEED MEMORY DESIGN

BACKGROUND

1. Field

An embodiment of the present invention relates to the field of integrated circuits and, more particularly, to sensing data stored in a memory.

2. Discussion of Related Art

Memory access speed can have a significant impact on processor and/or system performance. For a high-speed microprocessor, for example, an on-chip cache memory that is unable to keep up with the speed of the processor core can slow down the entire processor.

FIG. 1 is a simplified block diagram of a prior cache memory block 100 and corresponding sensing circuitry 105. The cache memory block 100 of this example is organized into upper and lower blocks 106 and 107, respectively. To sense selected data stored in the cache memory block 100 in response to a read operation, for example, a sense amplifier (sense amp) 110 is enabled by asserting a sense enable signal received by a sense enable input 112. D and D# inputs to the sense amplifier 110 are selectively coupled by one of the column multiplexers 115 or 120 to full swing bitlines B and B# corresponding to memory location(s) to be accessed.

Output data from the sensing operation may be provided on one or more of the differential output signal lines O and O# that are coupled to input signal lines D and D#. The sensed data on one or more of the output signals lines O and/or O# is then latched by one or more latches 125 and forwarded over a signal line 130 to requesting circuitry, such as a processor core (not shown). The signal line 130 between the latch 125 and the requesting circuitry may traverse other cache memory blocks and may be relatively long.

An issue may arise when the cache memory that includes the cache memory block 100 is very large and/or an integrated circuit device including the cache memory block 100 operates at a high speed. The time required to sense data from the cache memory and provide it to a processor core or other circuitry may be longer than desired such that the speed of the processor or other devices may be adversely affected.

The slower than desired nature of the sensing operation may be due to the time required for full-swing signals to transition and/or long routing wires that are dominated by resistive-capacitive (RC) delays, particularly for large cache memories, and other factors.

Further, the cache memory block 100 and associated sensing circuitry 105 may consume more power than desired.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A multi-level, low voltage swing, memory sensing scheme is described. In the following description, particular memory configurations and integrated circuit devices are described for purposes of illustration. It will be appreciated, however, that other embodiments are applicable to different types of memories configured in a different manner and to other types of integrated circuit devices.

For one embodiment, a low voltage swing cache memory includes a block of memory cells and low voltage swing local bitlines to indicate data stored in the block of memory. The cache memory also includes low voltage swing global bitlines coupled to the local bitlines to indicate data sensed from the local bitlines. The low voltage swing local bitlines are sensed on a transition of a first clock signal while the global bitlines are sensed on a transition of a second clock signal in order to provide a high-speed multi-level sensing scheme. The cache memory and sensing scheme of various embodiments are described in more detail below.

Figure 1:
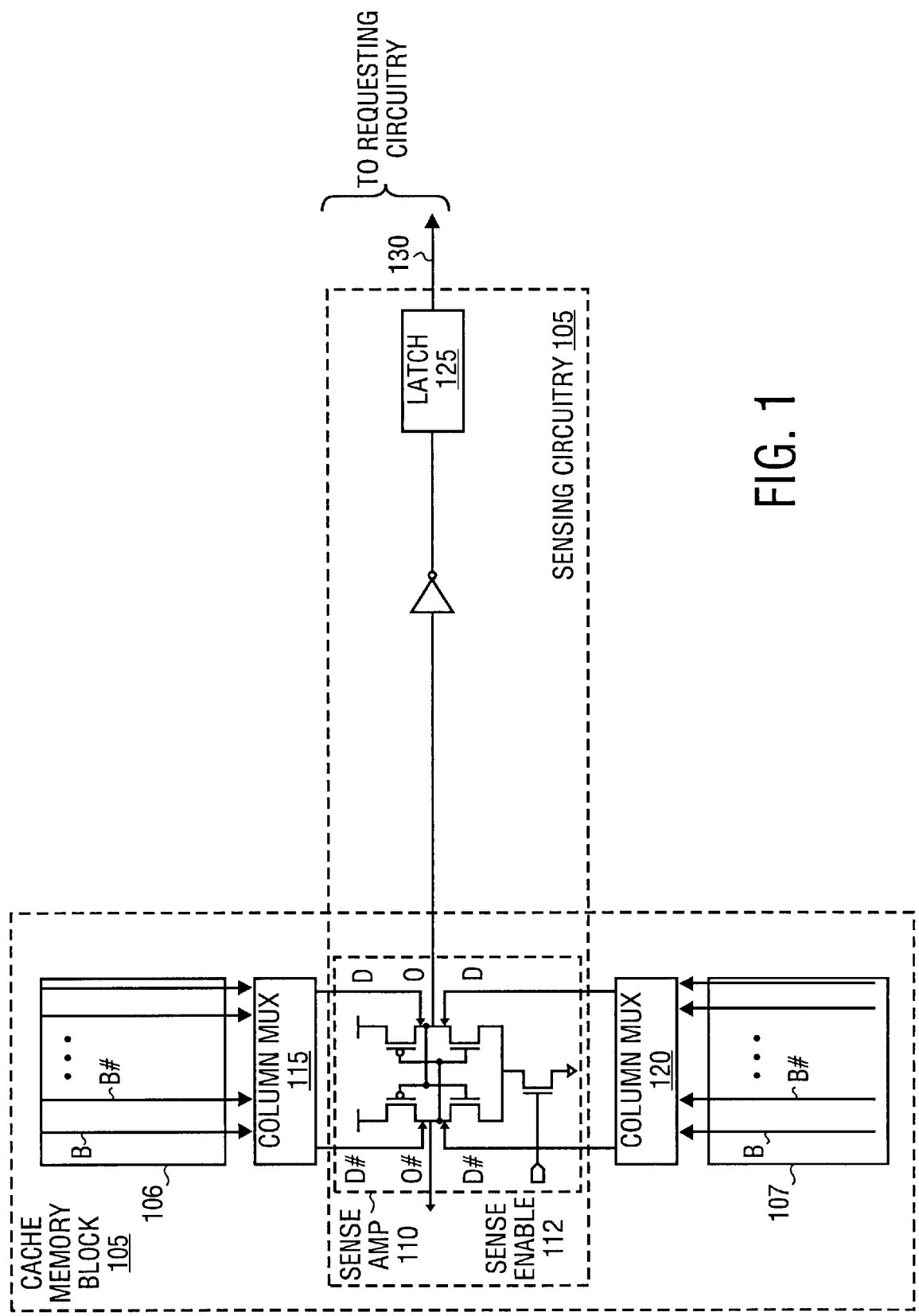
FIG. 1 is a simplified block diagram of a prior cache memory and associated sensing circuitry.
Figure 2:
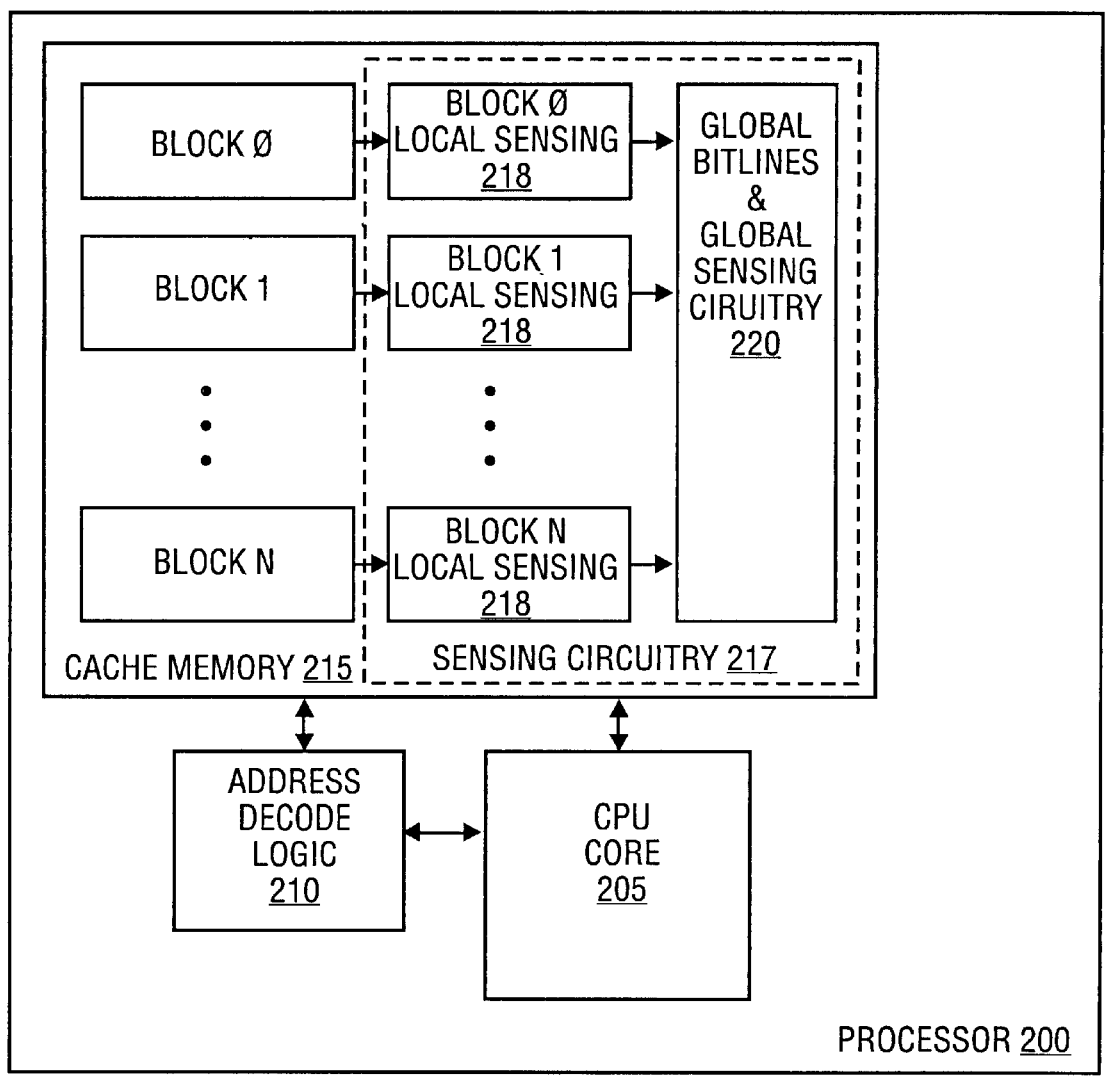
FIG. 2 is a simplified block diagram of a processor including a cache memory and corresponding multi-level, low voltage swing sensing circuitry of one embodiment.

FIG. 2 is a simplified block diagram of a processor 200 including a processor (CPU) core 205 to process instructions, address decode logic 210 to decode addresses corresponding to memory locations indicated by the instructions, and an on-chip cache memory 215 of one embodiment. It will be appreciated that the processor 200 may include other types of circuitry and/or circuit blocks such as, for example, a bus interface unit, additional memories, etc.

For one embodiment, the cache memory 215 includes memory blocks 0 . . . N (where N may be any positive integer) and sensing circuitry 217. Each of the blocks 0 . . . N may include the same number of memory cells or a different number of memory cells. For one embodiment, for example, the cache memory 215 may include 8 blocks each including 8 KB of memory. For other embodiments, a different number of blocks may be included and/or the blocks may be different sizes.

Each of the cache memory blocks 0 . . . N is coupled to corresponding local sensing circuitry 218 as shown in FIG. 2. The local sensing circuitry 218 corresponding to each of the blocks 0 . . . N is coupled to global bitlines and global sensing circuitry 220. The cache memory 215 and associated sensing circuitry 217 of FIG. 2 are described in more detail in reference to FIG. 3.

Figure 3:
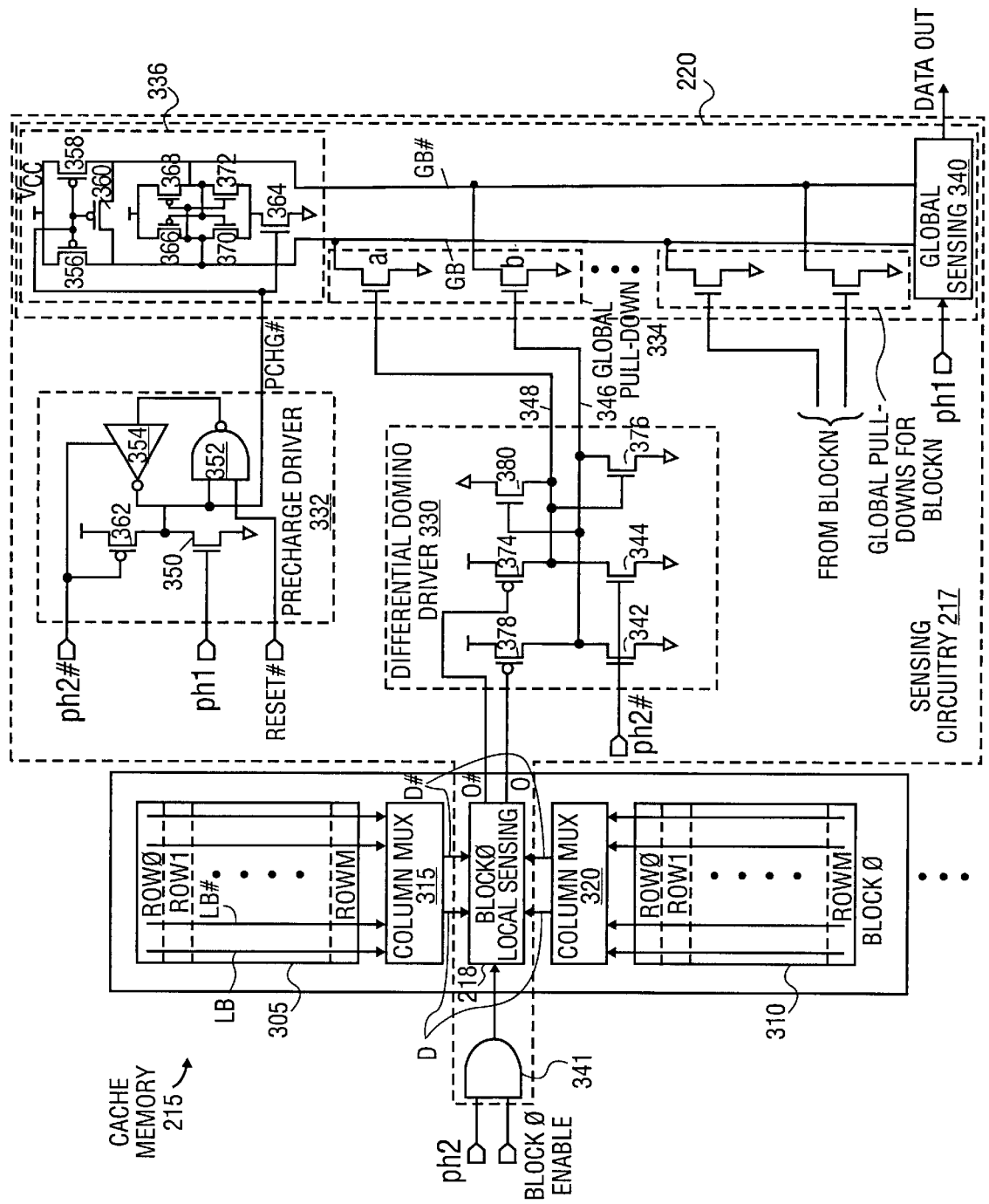
FIG. 3 is a schematic diagram showing a portion of the cache memory and multi-level sensing circuitry of FIG. 2 in more detail.

FIG. 3 is a schematic diagram showing block 0 of the cache memory 215 as well as local and global sensing circuitry of FIG. 2. While block O and associated circuitry are shown in FIG. 3 for purposes of illustration, it will be appreciated that the remaining blocks of the cache memory 215 may be configured and sensed in a similar manner. Further, while the sensing circuitry shown in FIG. 3 senses a single memory bit, it will be appreciated that each of the circuits described below may be replicated for the number of bits that may be read at a time.

For one embodiment, block 0 of the cache memory 215 includes upper and lower cache blocks 305 and 310, respectively, each including rows 0 . . . M where M may be any positive integer. Where block 0 includes 8 KB of memory, for example, each of the upper and lower blocks 305 and 310 within block 0 may include 32 rows of memory. Low voltage swing local bitlines, such as the local bitlines LB and LB# are also included within block 0. While only four pairs of local bitlines are shown in FIG. 3, it will be appreciated that the number of local bitline pairs corresponds to the number of columns in the corresponding memory block for one embodiment.

Low voltage swing column multiplexers (muxes) 315 and 320 selectively transfer data indicated by a pair of local bitlines to the local sensing circuit 218 in a manner well-known to those of ordinary skill in the art. The column muxes 315 and 320 may include select lines that are controlled by the address decode logic 210 of FIG. 2, for example.

The sensing circuitry 217 of one embodiment includes the block 0 local sensing circuit 218, a differential domino driver circuit 330, a precharge driver circuit 332, global pull-down devices 334, global bitlines GB and GB#, precharge, equalizer and keeper circuitry 336, and a global sensing circuit 340. It will be appreciated that, for other embodiments, the sensing circuitry 217 may be configured in a different manner. For example, the differential domino driver 330 may be replaced by a different type of driver and/or complementary logic may be used to implement some or all of the circuits.

Referring to FIGS. 2 and 3, in operation, an instruction executed by the CPU core 205, for example, may indicate data to be read from the cache memory 215. Address decode logic 210 decodes an address indicated by the instruction to identify the memory location(s) in the cache memory 215 to be accessed. The address decode logic 210 controls wordline signals (not shown) to access one or more rows of the upper 305 and/or lower 310 blocks of memory. Data from the accessed row is provided on small swing local bitline pairs LB and LB# to the corresponding column mux 315 or 320. Column mux 315 and 320 select signals (not shown) are controlled by the address decode logic 210 such that data stored in the indicated memory location(s) is provided at outputs of the column mux(es) 315 and/or 320. Outputs of the column muxes 315 and 320 are coupled to corresponding differential inputs D and D# of the block 0 local sensing circuit 218.

Figure 4:
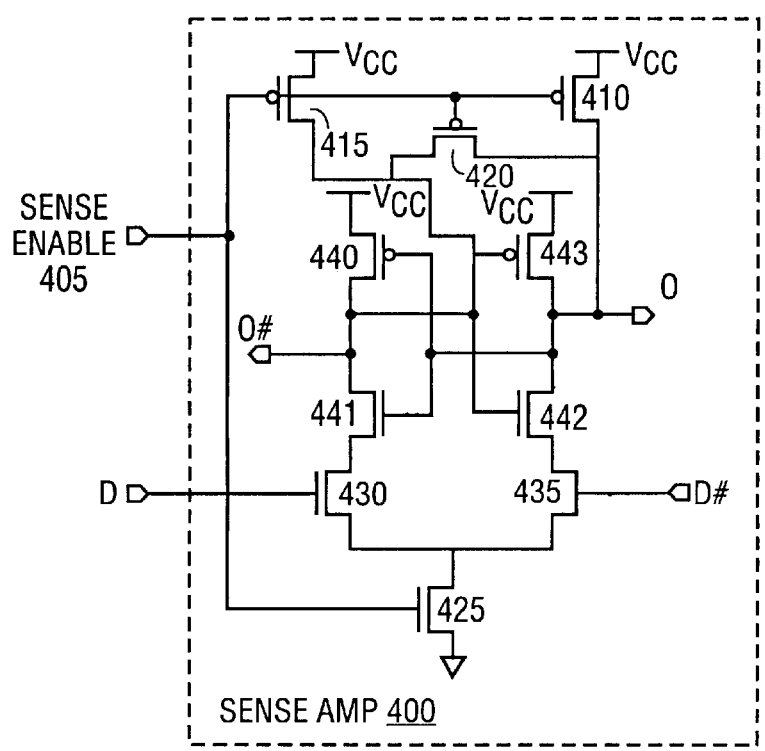
FIG. 4 is a schematic diagram showing a sense amplifier of one embodiment that may be used in the sensing circuitry of FIG. 3.

For one embodiment, both the local sensing circuit 218 and the global sensing circuit 340 are sense amplifiers similar in configuration and operation to a sense amplifier (sense amp) 400 of FIG. 4. The sense amp 400 receives a small swing differential input signal on inputs D and D# and provides a full swing differential output signal on outputs O and O#.

Full swing signals, as the term is used herein, are rail-to-rail signals that typically have a voltage swing equal to the difference between a high supply voltage, such as Vcc, and a low supply voltage, such as ground, for the surrounding circuitry. Thus, if an integrated circuit device has a Vcc of 1.8 volts, for example, a full swing signal alternates between ground and Vcc and thus, has a voltage swing of 1.8 volts.

Small swing or low voltage swing signals, as the terms are used interchangeably herein, refer to signals with a voltage swing smaller than that of full swing signals. In some cases, the voltage swing may be substantially smaller than that of full swing signals. For one implementation of the multi-level sensing circuit described herein, for example, the small swing signals may have a voltage swing as low as 100 mV or, in some cases, even lower. The logic value indicated by such small swing signals is determined to be a logic high value (i.e. logic 1) if the true signal has a higher potential than the complement signal (e.g. X>X#). If, instead, the complement signal has a higher potential than the true signal (e.g. X#>X), then a logic low value (i.e. logic 0) is indicated. The use of differential signals in the various embodiments is described in more detail below.

The sense amp 400 also receives a sense enable signal on a sense enable input 405. As shown in FIG. 3, the enable signal for the block 0 local sensing circuit 218 of one embodiment is provided at an output of an AND gate 341 that receives a phase 2 (ph2) clock signal and a block 0 enable signal. In this manner, the block 0 local sensing circuit is only enabled when block 0 is selected (i.e. when the memory location(s) to be accessed is in block 0). The block 0 enable signal may be received, for example, from the address decode logic 210 of FIG. 2. The enable signal for the global sensing circuit 340 of one embodiment is provided by the phase 1 (ph1) clock signal.

Figure 5:
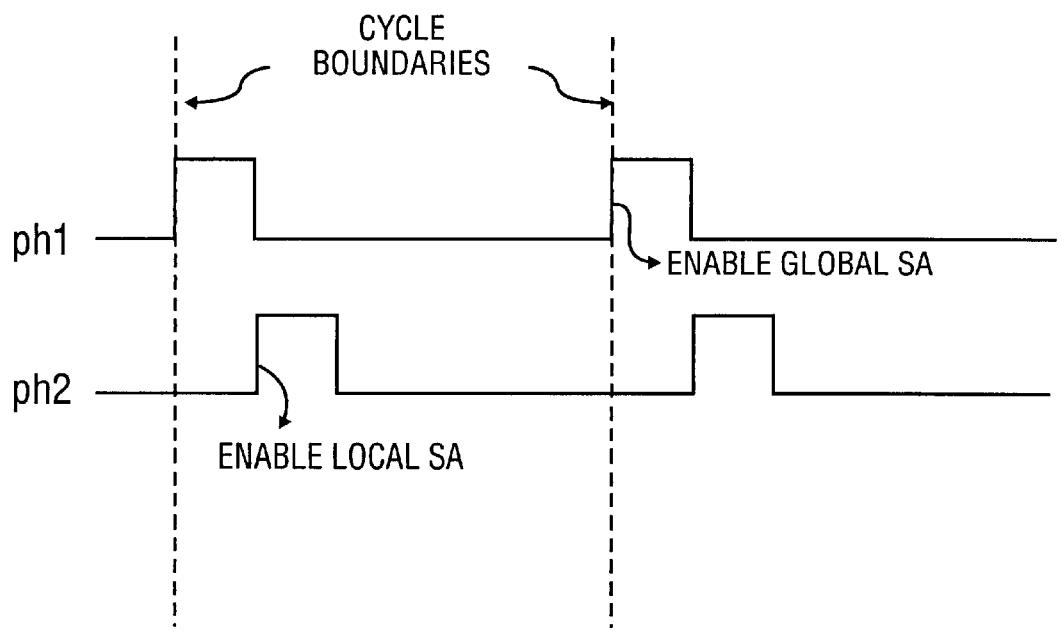
FIG. 5 is a timing diagram showing an exemplary relationship between various signals that may be used in the multi-level sensing circuitry of FIG. 3.

For one embodiment, the phi and ph2 clock signals are pulsed clock signals as shown in FIG. 5. The pulse of the ph2 clock, for this example, closely follows, but does not overlap with, the pulse of the phi clock. For an alternative embodiment, phi and ph2 signals may be 50% duty cycle clock signals that are complements of each other. The power dissipation of the sensing circuitry 217 of this embodiment may, however, be higher than that of embodiments for which pulsed clock signals are used.

For the embodiment shown in FIG. 4, the sense amp 400 outputs O and O# are precharged high by precharge devices 410 and 415 and equalized by an equalizer device 420 when the active high sense enable signal 405 is deasserted.

When the sense enable signal is asserted, the precharge and equalization devices 410, 415 and 420 are turned off and a sense enable device 425 is turned on. If small swing signals received at the D and D# inputs indicate a logic high data value (i.e. the potential of D>D#), the gate 430 is enabled and the output node O# is pulled to ground. In this manner, a full swing logic high value is indicated by differential nodes O and O#.

Alternatively, if small swing signals received at the D and D# inputs indicate a logic low data value (i.e. the potential of D<D#), the gate 435 is turned on and the output node O is pulled to ground. The differential output nodes O and O# then indicate a full swing logic low value. The transistors 440–443 act as a keeper or latch to hold the data as sensed.

If the sense amp 400 is not enabled, the output nodes O and O# remain precharged such that less power may be dissipated. Thus, for the local sensing circuit 218, if block 0 is not selected to be accessed, the output nodes of the local sense amp 218 will remain precharged.

For one embodiment, each of the transistors in the sense amp 400 is a metal oxide semiconductor field effect transistor (MOSFET). For other embodiments, different types of transistors may be used.

The sense amp 400 is different from conventional sense amps in that the inputs D and D# are decoupled from the outputs O and O#. In this manner, data can be read from the outputs even while precharging of the sense amp 400 is beginning.

Referring back to FIG. 3, the precharge driver 332, via an output precharge signal PCHG#, controls precharging and equalization of the global bitlines GB and GB# and also provides an enable signal for the keeper circuit in the precharge, equalizer and keeper circuit 336. The precharge driver 332 receives the ph1 signal, and a complement of the ph2 signal (ph2#) as shown. The precharge driver 332 also receives the complement of a reset signal (RESET#) which is asserted (i.e. at a logic high level) unless a power up or other reset procedure is in process.

As shown in FIG. 3, assuming a reset operation is not taking place, during a phi pulse, the gate 350 is turned on, an output of a NAND gate 352 is low and an output of an inverter 354 is high. The PCHG# signal line is, therefore, pulled low. When the PCHG# signal line is pulled low, precharge devices 356 and 358 and an equalizer device 360 in the precharge, equalizer and keeper circuit 336 are turned on to precharge and equalize the global bitlines GB and GB#.

For the embodiment shown in FIG. 3, the global bitlines GB and GB# are precharged high to Vcc or another non-ground supply voltage. The operation of the keeper portion of the circuit 336 is described below.

With continuing reference to FIG. 3, the operation of the differential domino driver 330 is now described. The differential domino driver 330 is coupled to outputs O and O# of the local sensing circuit 218 as shown and also receives a complement of the ph2 signal (ph2#). The differential domino driver 330 operates to improve the quality of output signals O and O# from the local sensing circuit 218 as they are communicated to the global sensing lines GB and GB#. In this manner, the differential domino driver 330 helps to improve the robustness of the sensing circuitry 217.

In operation, when the ph2 signal is deasserted (i.e. while the local sensing circuit 218 is precharging), ph2# is high such that pull-down devices 342 and 344 are turned on to precharge the driver circuit 330 low. When turned on, the pull down devices 342 and 344 pull the signal lines 346 and 348 down to ground such that global pull-down devices 334a and 334b coupled to global bitlines GB and GB#, respectively, are prevented from being turned on.

When the ph2 signal is asserted (causing the local sensing circuit 218 to sense the local bitlines LB and LB#), the ph2# signal is low. If data at outputs O and O# of the local sensing circuit 218 indicates a logic high value, a pull-up device 374 is turned on pulling the signal line 348 high. Pulling the signal line 348 high turns on the global pull-down device 334a to pull the global signal line GB towards ground. Turning on the pull-up device 374 also causes a pull-down device 376 to be enabled to pull the signal line 346 low. Pulling the signal line 346 low helps to ensure that the global pull down device 334b is not turned on and thus, that the global bitline GB# remains at the precharged high level.

If data at the local sensing circuit 218 instead indicates a logic low level (i.e. O<O#), a pull up device 378 is instead turned on causing the signal line 346 to be pulled high and turning on a pull-down device 380. Turning on the pull-down device 380 causes the signal line 348 to be pulled low. In this manner, the global pull-down device 334a is prevented from being turned on while the global pull-down device 334b is enabled, pulling the low voltage swing global bitline GB# towards ground.

Global pull-down devices similar to the global pull-down devices 334 are also coupled to the global bitlines GB and GB# in a similar manner for each of the other blocks of the cache memory 215 of FIG. 2. Global pull-down devices for the other blocks of the cache memory 215 are similarly responsive to data sensed from the local bitlines of the corresponding block to indicate data stored in the corresponding block.

Use of pulsed clock signals ph1 and ph2 causes the signal swing on the global bitlines GB and GB# to be small because there is not enough time for full swing signals to develop on the precharged bitlines during the evaluate phase (i.e. the time during which data on the global bitlines GB and GB# is valid and may be sensed by the global sensing circuit 340).

After data from block 0 of the memory is sensed by the local sensing circuit 218 in response to a ph2 clock pulse, the data is provided to the global bitlines GB and GB# by the differential domino driver 330 as described above. The global sensing circuit 340 is then enabled in response to a ph1 clock pulse to sense the data indicated by the global bitlines GB and GB#. Where the global sensing circuit 340 is a sense amp similar to the sense amp 400 of FIG. 4, the global bitline GB is coupled to the D input of the sense amp 340 and the global bitline GB# is coupled to the D# input. The ph1 clock signal operates as the sense enable signal and is received by the sense enable input. A corresponding full swing differential output signal indicating the sensed data is provided on O and O# outputs. If only a single-ended signal is desired, succeeding logic (not shown) may only be coupled to one of the outputs O or O#. This output signal may be provided back to the CPU core of FIG. 2, for example, in response to the read operation or to other requesting circuitry.

As described above, the PCHG# signal is also responsive to a phi pulse to begin precharging the global bitlines GB and GB#. The PCHG# signal, however, is delayed by one gate delay (the delay through gate 350) from the time the global sensing circuit 340 is enabled. In this manner, precharging of the global bitlines begins just after the global bitlines are sensed.

Exemplary timings for the above-described multi-level sensing scheme are shown in the timing diagram of FIG. 5. As shown, the multi-level sensing scheme of some embodiments may be completed within one clock cycle such that high-speed memory accesses are enabled.

Because the global bitlines GB and GB# are sensed at the cycle boundary for one embodiment, a signal keeper circuit is included in the circuit 336. The keeper circuit includes a keeper enable device 364 and transistors 366, 368, 370 and 372. In operation, when the ph2 signal is asserted, the ph2# signal is low. In response to the ph2# signal being low, the pull-up device 362 is turned on, an output of the NAND gate 352 is low and an output of the inverter 354 is high such that the PCHG# signal is pulled high. The keeper enable gate 364 is turned on as the PCHG# signal goes high.

Once the keeper enable gate 364 is turned on, if the global bitlines GB and GB# indicate a logic high value (i.e. GB>GB#), the gate 372 is turned on to keep the global bitline GB# pulled low (below Vcc) while the gate 366 is turned on to keep the global bitline GB pulled high. Alternatively, if the global bitlines GB and GB# indicate a logic low value (i.e. GB<GB#), the gates 368 and 370 are turned on to pull the GB# line high and the GB line low, respectively. Using the keeper circuit, data on the global bitlines GB and GB# may remain valid until a new clock cycle begins. The keeper circuit is disabled in response to the ph1 signal transitioning to a logic high value.

As for the sense amplifier of FIG. 4, the transistors in other circuits of FIG. 3 are MOSFETs for one embodiment. For other embodiments, different types of transistors and processing technologies may be used.

With continuing reference to FIG. 3, in designing the sensing circuitry 217, it is desirable for one embodiment to size the global pull-down devices 334 to be as small as possible while still providing enough differential on the global bitlines GB and GB# to be detected by the global sense amp 340. The sizes of the devices in the differential domino driver 330 may depend on the sizes of the global pull-down devices 334. The differential domino driver 330 transistors of one embodiment are sized to be as small as possible while still being large enough to drive the global pull-down devices 334. The devices in the precharge, equalizer and keeper circuit 336 may be quite small and thus, take up very little area. Devices in the sense amp 400 may be selected based on the succeeding logic (not shown) to be driven by the sense amp.

Figure 6:
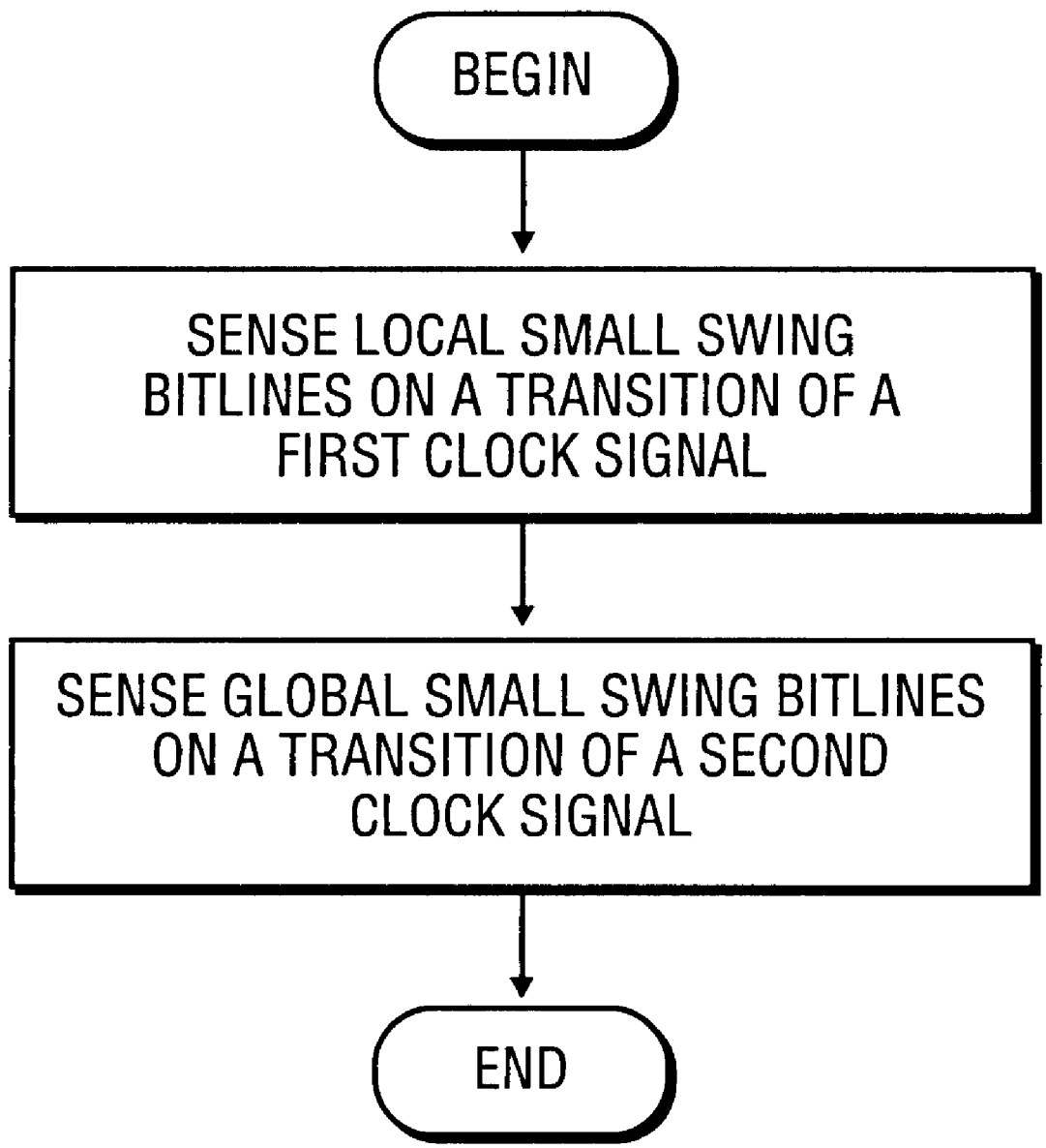
FIG. 6 is a flow diagram showing a method of one embodiment for sensing data stored in a memory.

FIG. 6 is a flow diagram showing a method of one embodiment for sensing data stored in a cache memory. At block 605, local small swing bitlines are sensed on a transition of a first clock signal to read data stored in a memory. At block 610, global small swing bitlines are sensed on a transition of a second clock signal. For one embodiment, additional actions such as precharging and equalizing the global bitlines, maintaining a data value indicated by the global bitlines for an entire clock cycle, and driving data sensed from the local small swing bitlines to the global bitlines may also be included for various embodiments.

In accordance with the above-described embodiments, a multi-level sensing scheme is provided that may offer speed, area and power advantages over prior cache memory sensing approaches. Some embodiments enable even large cache memories to be sensed within one clock cycle. Further, as compared to some prior cache memories, the sensing power may be significantly reduced due to the lower voltage swing signals and the smaller device sizes at the global bitline level. The area consumed by the sensing circuits may also be reduced.

It will be appreciated that, while an on-chip cache memory is described above, various embodiments are also applicable to off-chip cache memories or other types of differential memory systems. Further, while the above example includes a cache memory organized in blocks, and references are made to particular cache memory sizes for purposes of example, other embodiments may be advantageously used with memories of different sizes and/or that are organized in a different manner.

In the foregoing specification, the invention has been described with reference to specific exemplary embodiments thereof. It will, however, be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus comprising:
   a block of memory;
   low voltage swing local bitlines to indicate data stored in the block of memory, the low voltage swing local bitlines to be sensed on a transition of a first clock signal;
   low voltage swing global bitlines to be sensed on a transition of a second clock signal;
   a global pull down device responsive to data indicated by the local bitlines to pull down one of the global bitlines prior to the transition of the second clock signal; and
   a differential domino driver coupled between the local bitlines and the global pull down device.

2. The apparatus of claim 1 wherein the block of memory is a block of cache memory.

3. The apparatus of claim 1 further comprising:
   a first sense amplifier to sense data indicated by the local bitlines, the first sense amplifier to be enabled on the transition of the first clock signal; and
   a second sense amplifier to sense data indicated by the global bitlines, the second sense amplifier to be enabled on the transition of the second clock signal.

4. The apparatus of claim 3 wherein inputs to the first and second sense amplifiers are decoupled from outputs of the respective sense amplifiers such that precharge and evaluate phases of the sense amplifiers may overlap.

5. The apparatus of claim 1 wherein the global pull down device is to be controlled by the differential domino driver to pull down one of the global bitlines in response to data sensed by the first sense amplifier.

6. The apparatus of claim 5 further comprising:
   a precharge circuit coupled to the low voltage swing global bitlines to precharge the global bitlines; and
   an equalizer circuit coupled to the global bitlines to equalize the global bitlines.

7. The apparatus of claim 5 further comprising:
   a keeper circuit coupled to the global bitlines to maintain a value indicated by the global bitlines for a given time.

8. An apparatus comprising:
   a first block of memory including associated low voltage swing local bitlines to indicate data stored in the first block of memory;
   a first local sensing circuit to be enabled on a transition of a first clock signal to sense data on the local bitlines corresponding to the first block of memory, outputs of the first local sensing circuit being decoupled from inputs of the first local sensing circuit such that a precharge phase and an evaluate phase may overlap;
   low voltage swing global bitlines;
   a global pull down device associated with the first block of memory to pull down one of the global bitlines in response to data sensed by the first local sensing circuit; and
   a second global sensing circuit to be enabled on a transition of a second clock signal to sense data on the global bitlines.

9. The apparatus of claim 8 wherein the first and second sensing circuits are sense amplifiers, and wherein outputs of the second sensing circuit are decoupled from inputs of the second sensing circuit such that precharge and evaluate phases for the second sensing circuit may overlap.

10. The apparatus of claim 9 further comprising:
    a second block of memory including corresponding local bitlines to indicate data stored in the second block of memory;
    a second local sensing circuit to be enabled on the transition of the first clock signal to sense data on the local bitlines corresponding to the second block of memory; and
    a global pull-down device corresponding to the second block of memory to pull down one of the global bitlines in response to data indicated on the local bitlines corresponding to the second block of memory.

11. The apparatus of claim 8 further comprising:
    a differential domino driver coupled between the global bitlines and the local bitlines corresponding to the first block, the differential domino driver to control the global pull-down device responsive to data indicated on the local bitlines corresponding to the first block.

12. The apparatus of claim 8 further comprising:
a precharge circuit to precharge the global bitlines responsive to the second clock signal.

13. The apparatus of claim 8 further comprising:
a keeper circuit to keep a value indicated by the global bitlines valid responsive to the first clock signal.

14. A processor comprising:
a processor core to execute instructions;
address decode logic coupled to the processor core to decode an address corresponding to an instruction; and
an on-chip memory coupled to the processor core and the address decode logic, the on-chip memory comprising:
a first block of memory;
a first pair of low voltage swing local bitlines to indicate data stored in the first block of memory;
a first sensing circuit to sense data on the local bitlines on a transition of a first clock signal, an output of the first sensing circuit being decoupled from an input of the first sensing circuit such that precharge and evaluate operations can overlap;
low voltage swing global bitlines coupled to the local bitlines; and
a first global pull-down device to pull down one of the global bitlines in response to data indicated by the local bitlines.

15. The processor of claim 14 wherein the on-chip memory is a cache memory and the block of memory is a block of cache memory.

16. The processor of claim 14 further comprising:
a global sense amplifier to sense data indicated by the global bitlines, the global sense amplifier to be enabled on the transition of the second clock signal.

17. The processor of claim 16 wherein inputs to the global sense amplifier are decoupled from outputs of the global sense amplifier such that precharge and evaluate phases of the global sense amplifier may overlap.

18. The processor of claim 16 further comprising:
a differential domino driver circuit having an input coupled to the first sense amplifier and an output coupled to the global bitlines, the differential driver circuit to decrease noise on an output signal from the first sense amplifier.

19. The processor of claim 16 wherein the first global pull down device is to be controlled by the differential domino driver to pull down one of the global bitlines in response to data sensed by the first local sense amplifier.

20. The processor of claim 19 further comprising:
a precharge circuit coupled to the low voltage swing global bitlines to precharge the global bitlines; and
an equalizer circuit coupled to the global bitlines to equalize the global bitlines.

21. The processor of claim 19 further comprising:
a keeper circuit coupled to the global bitlines to maintain a value indicated by the global bitlines for a given time.

22. The processor of claim 19 wherein the memory further includes:
a second block of memory;
a second pair of low voltage swing local bitlines to indicate data stored in the second block of memory, the second pair of low voltage swing local bitlines to be sensed on the transition of the first clock signal;
a second local sense amplifier to sense data indicated by the second pair of local bitlines; and
a second global pull-down device to be controlled by the differential domino driver to pull down one of the global bitlines in response to data sensed by the second local sense amplifier.

23. The processor of claim 22 wherein the first and second local sense amplifiers are to be selectively enabled by the address decode logic in response to an instruction executed by the processor core.

24. A method comprising:
precharging outputs of a sense amplifier;
sensing local small swing bitlines on a transition of a first clock signal to read data stored in a memory at inputs of the sense amplifier, wherein precharging and sensing overlap in time;
selectively pulling down one of the global bitlines in response to data sensed from the local bitlines; and
sensing global small swing bitlines on a transition of a second clock signal, the global small swing bitlines to indicate data sensed from the local small swing bitlines.

25. The method of claim 24 further comprising:
precharging the global bitlines prior to sensing the global bitlines.

26. The method of claim 24 wherein
sensing local bitlines includes sensing local bitlines corresponding to a selected one of multiple blocks of memory.

27. The apparatus of claim 9 wherein the first sensing circuit is to provide a substantially full swing output signal.

* * * * *

UNITED STATES PATENT AND TRADEMARK OFFICE
CERTIFICATE OF CORRECTION

PATENT NO.   : 6,442,089 B1
DATED        : August 27, 2002
INVENTOR(S)  : Fletcher et al.

It is certified that error appears in the above-identified patent and that said Letters Patent is hereby corrected as shown below:

<u>Column 4,</u>
Lines 21, 24 and 25, delete "phi", insert -- ph1 --.

<u>Column 5,</u>
Line 7, delete "phi", insert -- ph1 --.

<u>Column 6,</u>
Line 26, delete "phi", insert -- ph1 --.

Signed and Sealed this

Twenty-eighth Day of January, 2003

JAMES E. ROGAN
*Director of the United States Patent and Trademark Office*